(12) United States Patent
Yoo et al.

(10) Patent No.: US 8,189,399 B2
(45) Date of Patent: May 29, 2012

(54) EEPROM HAVING SINGLE GATE STRUCTURE AND METHOD OF OPERATING THE SAME

(75) Inventors: Seung-han Yoo, Seongnam-si (KR); Hoon Chang, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 199 days.

(21) Appl. No.: 12/787,629

(22) Filed: May 26, 2010

(65) Prior Publication Data

US 2010/0238738 A1 Sep. 23, 2010

Related U.S. Application Data

(63) Continuation of application No. 11/682,619, filed on Mar. 6, 2007, now Pat. No. 7,755,135.

(30) Foreign Application Priority Data

Jun. 28, 2006 (KR) .......................... 10-2006-0058879

(51) Int. Cl.
*G11C 11/34* (2006.01)
*G11C 16/04* (2006.01)

(52) U.S. Cl. ............... 365/185.29; 365/185.28; 257/321

(58) Field of Classification Search ............. 365/185.29, 365/185.28; 257/314–326, 327
See application file for complete search history.

(56) References Cited

U.S. PATENT DOCUMENTS

| | | | | |
|---|---|---|---|---|
| 5,940,324 A | * | 8/1999 | Chi et al. | 365/185.27 |
| 6,100,560 A | * | 8/2000 | Lovett | 257/315 |
| 2009/0201742 A1 | * | 8/2009 | Lee et al. | 365/185.24 |

* cited by examiner

*Primary Examiner* — Van Nguyen
*Assistant Examiner* — Khamdan Alrobaie
(74) *Attorney, Agent, or Firm* — F. Chau & Associates, LLC

(57) ABSTRACT

An electrically erasable programmable read-only memory (EEPROM) includes an access transistor having a floating gate and source/drain regions formed at opposite sides of the floating gate in a first well, a first well tap formed in the first well, a control gate located on a second region, first impurity regions formed at both sides of the control gate in the second region, and a second well tap formed in a third region. In order to erase information stored in a memory cell, a predetermined erasing voltage is applied to the source/drain regions of the access transistor and the first well tap, a ground voltage is applied to the first impurity regions in the second region, and a voltage, which is greater than 0V and less than a junction breakdown voltage between the active area and the first well, is applied to the second well tap.

5 Claims, 2 Drawing Sheets

EEPROM HAVING SINGLE GATE STRUCTURE AND METHOD OF OPERATING THE SAME

CROSS-REFERENCE TO RELATED APPLICATION

This is a Continuation Application of U.S. patent application Ser. No. 11/682,619, filed Mar. 6, 2007, now U.S. Pat. No. 7,755,135, which claims the priority of Korean Patent Application No. 10-2006-0058879, filed on Jun. 28, 2006, in the Korean Intellectual Property Office, the disclosures of which are incorporated herein in their entirety by reference.

BACKGROUND OF THE INVENTION

1. Field of the Invention

The present invention relates to an electrically erasable programmable read-only memory (EEPROM) and a method of operating the same, and more particularly, to an EEPROM having a single gate structure and a method of operating the same.

2. Description of Related Art

Various memory cell structures have been suggested for a non-volatile EEPROM device capable of electrically programming and erasing data. In non-volatile memory devices data stored in memory cells is maintained even without a power supply voltage. A typical unit memory cell of an EEPROM has a floating gate, having a stacked gate structure, for storing data and a control gate formed on the floating gate with a dielectric layer interposed therebetween. As electronic devices become smaller and semiconductor device fabricating techniques become more advanced, system on chip (SOC), in which various semiconductor devices are included in one semiconductor chip, has emerged as an important architecture.

In order to fabricate an EEPROM embedded in a SOC, logic devices and the EEPROM are fabricated in the same process. The logic devices of the SOC typically employ a transistor having a single gate structure. Accordingly, an SOC fabrication process for embedding an EEPROM having a stacked gate structure in the SOC is complicated. To simplify the SOC fabrication process, an EEPROM having a single gate structure has been suggested. Employing an EEPROM having a single gate structure allows the SOC to be implemented using a typical complementary metal oxide semiconductor (CMOS) fabrication process which is applied in the fabrication of a logic device.

An EEPROM having a single gate structure includes an access transistor for reading data, and a control gate transistor for data programming. Operation modes of an EEPROM having a single gate structure include programming, reading, and erasing operation modes. In the programming operation mode and the erasing operation mode in which charges are trapped or released in a floating gate via a tunneling gate insulating layer, a high voltage needs to be applied to source/drain regions of the access transistor. However, since, in a typical process of fabricating an EEPROM having a single gate structure, source/drain regions of the EEPROM are formed using a well formed in the CMOS fabricating process, a junction breakdown voltage between the source/drain regions and wells surrounding the source/drain regions is low. Accordingly, there are constraints on applying a high voltage in the programming and erasing operation modes of the EEPROM.

SUMMARY OF THE INVENTION

According to an embodiment of the present invention, an electrically erasable programmable read-only memory (EEPROM) comprises an active area of a first conductivity type formed in a semiconductor substrate, a gate line formed on the active area, and a first well of a second conductivity type formed in a first region of the active area. The EEPROM further includes an access transistor having a floating gate formed of part of the gate line located on the first region, and a source region and a drain region formed at opposite sides of the floating gate in the first well, a first well tap of the second conductivity type spaced apart from the source/drain regions in the first well and having a higher impurity concentration than that of the first well, a control gate formed of part of the gate line located on a second region in the active area spaced apart from the first region, first impurity regions formed at both sides of the control gate in the second region of the active area, and a second well tap of the first conductivity type formed in a third region of the active area spaced apart from the first region and the second region and having a higher impurity concentration than that of the active area.

The active area may be formed of an N type well in the semiconductor substrate. The first well may be a P type well in the N type well, and the second well tap may be formed of an N+ type impurity region in the N type well. The source/drain regions may be formed of an N+ type impurity region.

The EEPROM may further comprise a first pocket well of the second conductivity type in the first region of the active area having a lower impurity concentration than that of the first well and surrounding the first well.

The EEPROM may further comprise a second well of the second conductivity type in the second region of the active area spaced apart from the first well and surrounding the first impurity regions, and a third well tap in the second well spaced apart from the first impurity regions and having a higher impurity concentration than that of the second well. The active area may be formed of an N type well formed in the semiconductor substrate, the second well may be a P type well in the N type well, and the third well tap may be formed of an N+ type impurity region in the N type well. The first impurity regions may be formed of an N+ type impurity region.

The EEPROM may further comprise a second pocket well of the second conductivity type in the second region of the active area having a lower impurity concentration than that of the second well and surrounding the second well.

According to another embodiment of the present invention, an EEPROM comprises an active area of a first conductivity type formed in a semiconductor substrate, a gate line formed on the active area, and an access transistor having a floating gate formed of part of the gate line located on a first region of the active area, and a source region and a drain region formed at opposite sides of the floating gate. The EEPROM further comprises a first well of a second conductivity type formed in a second region spaced apart from the first region of the active area, a control gate formed of part of the gate line located on the second region, first impurity regions formed at both sides of the control gate in the first well, a first well tap of the second conductivity type spaced apart from the first impurity regions in the first well and having a higher impurity concentration than that of the first well, and a second well tap of the first conductivity type formed in a third region of the active area spaced apart from the first region and the second region and having a higher impurity concentration than that of the active area.

The active area may be formed of an N type well in the semiconductor substrate. The first well may be a P type well in the N type well, and the second well tap may be formed of an N+ type impurity region in the N type well. The first impurity regions may be formed of an N+ type impurity region.

The EEPROM may further comprise a first pocket well of the second conductivity type in the first region of the active area having a lower impurity concentration than that of the first well and surrounding the first well.

According to yet another embodiment of the present invention, a method for erasing information stored in one memory cell including one access transistor and one control gate of an EEPROM comprises applying a predetermined erasing voltage to the source/drain regions of the access transistor and the first well tap, applying a ground voltage to the first impurity regions in the second region, and applying a voltage greater than 0V and less than a junction breakdown voltage between the active area and the first well to the second well tap. The same voltage as the erasing voltage may be applied to the second well tap.

When the memory cell further comprises a second well of the second conductivity type in the second region of the active area spaced apart from the first well and surrounding the first impurity regions, and a third well tap in the is second well spaced apart from the first impurity regions and having a higher impurity concentration than that of the second well, the ground voltage may be applied even to the third well tap in the second well upon applying the ground voltage to the first impurity regions in the second region.

According to yet another embodiment of the present invention, a method for programming information in one memory cell including one access transistor and one control gate of an EEPROM comprises applying the ground voltage to the source/drain regions, applying a predetermined programming voltage to the first impurity regions and the first well tap in the second region, and applying a voltage greater than 0V and less than a junction breakdown voltage between the active area and the first well to the second well tap. The same voltage as the programming voltage may be applied to the second well tap.

BRIEF DESCRIPTION OF THE DRAWINGS

The present invention will become more apparent by describing in detail embodiments thereof with reference to the attached drawings in which.

DETAILED DESCRIPTION OF PREFERRED EMBODIMENTS

Embodiments of the present invention will now be described more fully hereinafter with reference to the accompanying drawings.

Figure 1:
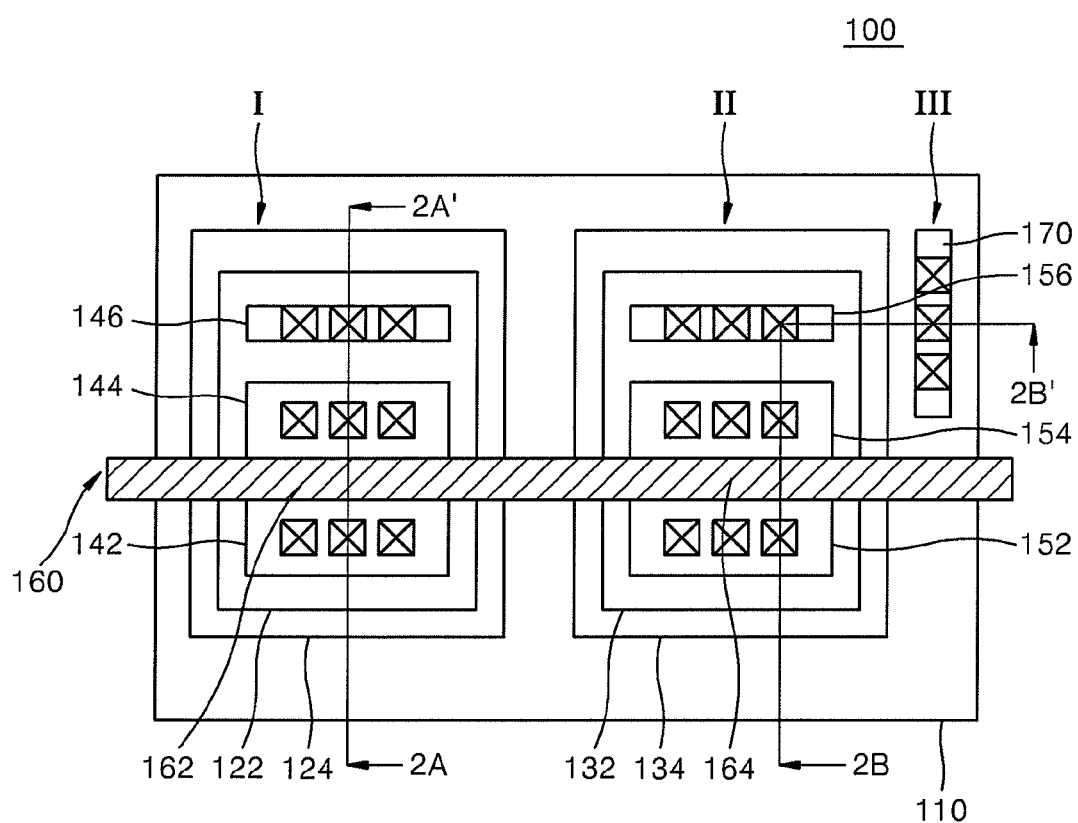
FIG. 1 illustrates a layout of a unit memory cell of an electrically erasable programmable read-only memory (EEPROM) according to an embodiment of the present invention.
Figure 2:
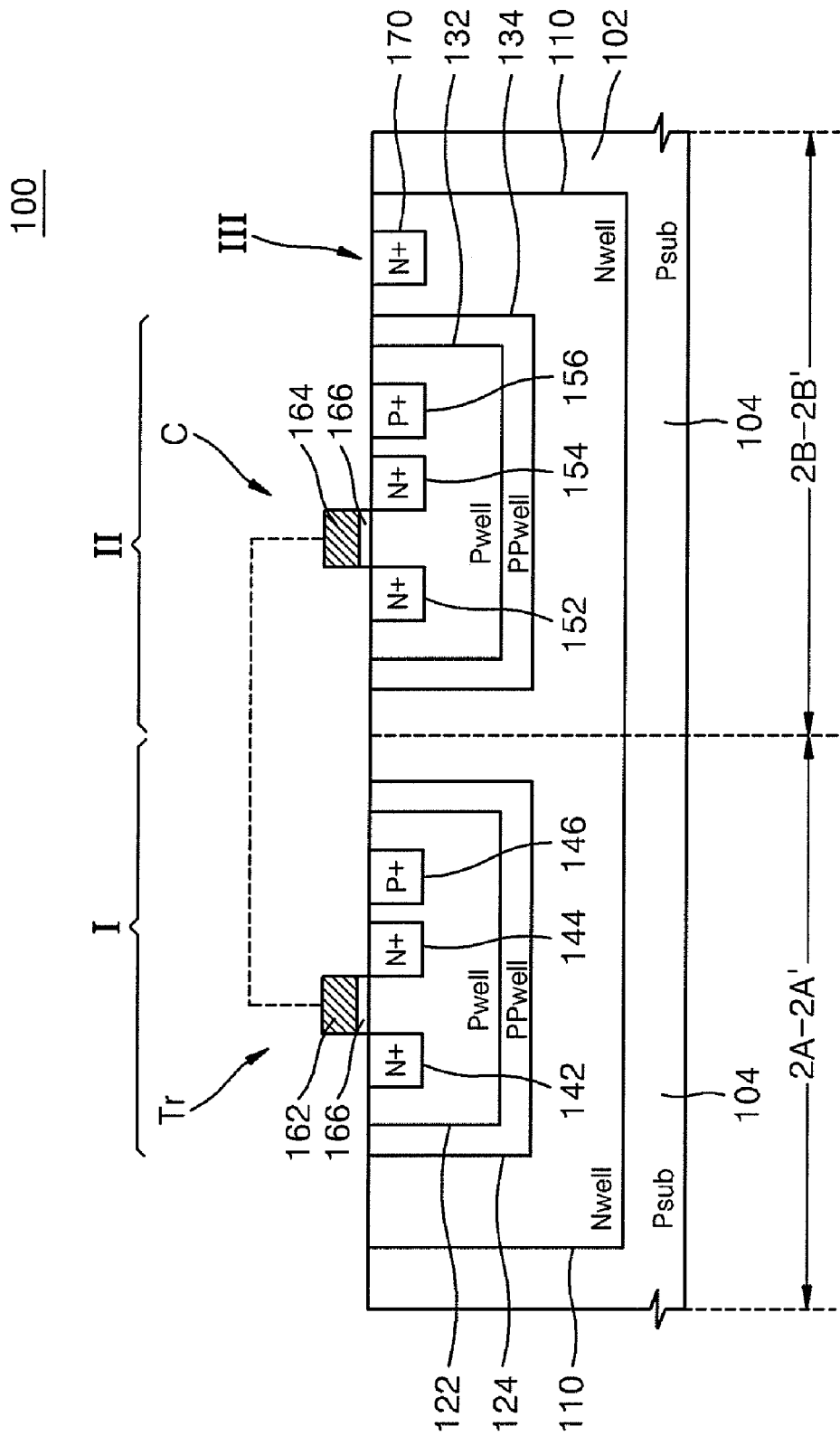
FIG. 2 is a cross-sectional view of the unit memory cell illustrated in FIG. 1, taken along the lines 2A-2A' and 2B-2B'.

FIG. 1 illustrates a layout of a unit memory cell of an electrically erasable programmable read-only memory (EEPROM) according to an embodiment of the present invention; and FIG. 2 is a cross-sectional view of the unit memory cell illustrated in FIG. 1, taken along the lines 2A-2A' and 2B-2B' of FIG. 1.

Referring to FIGS. 1 and 2, a unit memory cell 100 of an EEPROM according to an embodiment of the present invention includes an access transistor Tr, and a control gate 164 connected to a floating gate 162 of the access transistor Tr via a gate line 160. The control gate 164 is an electrode of a control metal oxide semiconductor (MOS) capacitor C. The other electrode of the control MOS capacitor C is formed of impurity regions 152 and 154 that are respectively formed at both sides of the control gate 164 in the semiconductor substrate 102, with a gate insulating layer 166 interposed between the control gate 164 and the impurity regions 152 and 154.

An active area 104 of the semiconductor substrate 102 includes a first region I in which the access transistor Tr is formed, and a second region II in which the control MOS capacitor C having the floating gate 164 is formed. The first region I and the second region II are spaced apart from each other. The active area 104 further includes a third region III spaced apart from the first region I and the second region II. A third region well tap 170, for applying a voltage to the semiconductor substrate 102, is formed in the third region III. The third region well tap 170 is formed as an impurity diffusion region having the same conductivity type as a neighboring region of the substrate, but has a higher impurity concentration than that of the neighboring region of the substrate. FIG. 2 shows an example in which an N type well 110 is formed in the active area 104 of the P type semiconductor substrate 102. Accordingly, in the example of FIG. 2, the third region well tap 170 is formed as an N+ type impurity region in the N type well 110. Embodiments of the present invention are not limited to such a structure. For example, if the N type well 110 is not formed and the third region well tap 170 is formed on the P type semiconductor substrate 102, the third region well tap 170 is formed as the P+ type impurity region.

A first well 122 is formed in the first region I, and a second well 132 is formed in the second region II. When the N type well 110 is formed in the active area 104 of the semiconductor substrate 102 as in the example of FIG. 2, the N type well 110 is formed to surround both the first well 122 and the second well 132, which are P type wells. In cases where the N type well 110 is formed, the term active area may be used to refer to the N type well 110.

In the first well 122, source/drain regions 142 and 144 are formed at both sides of the floating gate 162. FIG. 2 also shows an example in which the source/drain regions 142 and 144 are formed as an N+ type impurity region so that the access transistor Tr becomes an NMOS transistor.

A first region well tap 146 is formed in the first well 122. The first region well tap 146 is spaced apart from the source/drain regions 142 and 144 and has the same conductivity type as the first well 122 and a higher impurity concentration than that of the first well 122. Since, in the example of FIG. 2, the first region well tap 146 is formed in the first well 122 that is a P type well, the first region well tap 146 is formed as a P+ type impurity region.

The impurity regions 152 and 154 are formed at both sides of the control gate 164 and in the second well 132 of the second region II. FIG. 2 also shows an example in which the impurity regions 152 and 154 are formed as N+ type impurity regions.

Furthermore, the second region well tap 156 is formed in the second well 132. The second region well tap 156 is spaced apart from the impurity regions 152 and 154 and has the same conductivity type as the second well 132 and a higher impurity concentration than that of the second well 132. Since, in the example of FIG. 2, the second region well tap 156 is formed in the second well 132 that is a P type well, the second region well tap 156 is formed as a P+ type impurity region.

A first pocket well (PP well) 124 may be also formed in the first region I of the active area 104 surrounding the first well 122. The first pocket well 124 has the same conductivity type as the first well 122 and a lower impurity concentration than that of the first well 122.

A second pocket well 134 may be also formed in the second region II of the active area 104 surrounding the second well 132. The second pocket well 134 has the same conductivity type as the second well 132 and a lower impurity concentration than that of the second well 132.

The EEPROM memory cell according to an embodiment of the present invention as shown in FIGS. 1 and 2 may be formed using an LCD driver IC (LDI) fabrication process. In the LDI process, various transistors such as a low voltage (LV) transistor, a medium voltage (MV) transistor, and a high voltage (HV) transistor need to be formed. In order to form the transistors, various wells are formed in the substrate. Particularly, N type wells are formed in order to form the HV transistor. Accordingly, when the EEPROM memory cell according to an embodiment of the present invention as shown in FIGS. 1 and 2 is formed during the LDI fabricating process, N type wells for an HV transistor formed in the substrate may be used as the N type well 110 shown in FIG. 2. This eliminates a need for a separate process of forming wells during the implementation of the EEPROM memory cell according to an embodiment of the present invention.

As described above, the EEPROM according to an embodiment of the present invention includes the first region well tap 146 in the first region I, the second region well tap 156 in the second region II, and the third region well tap 170 in the third region III. Accordingly, by applying an erasing voltage to the first region well tap 146 and the third region well tap 170 when a relatively high erasing voltage, e.g., about 10V or more, is applied to the source/drain regions 142 and 144 during a data erasing operation, a junction breakdown phenomenon between the source/drain regions 142 and 144 and the first well 122 in the first region I, in which the access transistor Tr is formed, can be substantially prevented.

In a similar method, by applying a programming voltage to the second region well tap 156 and the third region well tap 170 when a relatively high programming voltage of about 10V or more is applied to the impurity regions 152 and 154 during the data programming operation, a junction breakdown phenomenon between the impurity regions 152 and 154 and the second well 122 in the second region II can be substantially prevented.

Particularly, when the erasing voltage is applied at a relatively high level to the source/drain regions 142 and 144, or the programming voltage is applied at a relatively high level to the impurity regions 152 and 154, a higher than expected external voltage may be applied at any given moment. However, even in this case, an erasing operation or programming operation can be stably performed by simultaneously applying the erasing voltage to the source/drain regions 142 and 144 and the first region well tap 146 or by simultaneously applying the programming voltage to the impurity regions 152 and 154 and the second region well tap 156.

Operation of the EEPROM according to an embodiment of the present invention will now be described with reference to FIG. 2.

In a data programming operation, a high voltage, e.g., a programming voltage of 20V, is applied to the impurity regions 152 and 154 and to the second region well tap 156 in the second region II, and a ground voltage is applied to the source/drain regions 142 and 144 and to the first region well tap 146 in the first region I. A voltage greater than 0V and less than a junction breakdown voltage between the N type well 110 and the second pocket well 134 is applied to the third region well tap 170. When the second pocket well 134 is not formed, a voltage greater than 0V and less than a junction breakdown voltage between the N type well 110 and the second well 132 is applied to the third region well tap 170.

When the second pocket well 134 surrounding the second well 132 is formed, a junction breakdown voltage can be made higher than when the second pocket well 134 is not formed. Accordingly, when a higher programming voltage is needed, the second pocket well 134 may be formed to increase the junction breakdown voltage. The same voltage as the programming voltage may be applied to the third region well tap 170.

When the data programming voltage is applied, electrons are Fowler-Nordheim tunneled (F-N tunneled) from the access transistor Tr to the floating gate 162, and then stored and programmed in the floating gate 162. Since a high voltage is applied to the second well 132 via the second region well tap 156, as well as to the impurity regions 152 and 154 upon application of the data programming voltage, junction breakdown between the impurity regions 152 and 154 and the second well 132 can be substantially prevented upon application of a high erasing voltage. In addition, since a high voltage is applied to the third region well tap 170, a PN diode junction between the second P+ region well tap 156 under the control gate 164 and the N type well 110 can be substantially prevented from being activated.

Upon the reading of data, in the first region I, a voltage of about 1.5V is applied to the floating gate 162, a ground voltage is applied to the source region of the source/drain regions 142 and 144, and a power supply voltage of about 1.5V is applied to the drain region. A ground voltage is also applied to the first region well tap 146. The ground voltage is also simultaneously applied to the impurity regions 152 and 154 and the second region well tap 156 in the second region II. The ground voltage or a high voltage of about 20V may be applied to the third region well tap 170.

When electrons are not stored in the floating gate 162, the above-described reading voltages are applied so that a channel is formed between the source/drain regions 142 and 144 under the floating gate 162 and the access transistor Tr is turned ON. When electrons are stored in the floating gate 162, a channel is not formed between the source/drain regions 142 and 144 under the floating gate 162 and the access transistor Tr is turned OFF. A reading operation can be performed by sensing ON or OFF states of the access transistor Tr.

Upon the erasing of the data, a high voltage, e.g., an erasing voltage of 20V is applied to the source/drain regions 142 and 144 of the access transistor Tr and the first well tap 146 in the first region I, and a ground voltage is applied to the impurity regions 152 and 154 and the second region well tap 156 in the second region II. A voltage greater than 0V and less than the junction breakdown voltage between the N type well 110 and the first pocket well 124 is applied to the third region well tap 170. When the first pocket well 124 is not formed, a voltage greater than 0V and less than the junction breakdown voltage between the N type well 110 and the first well 122 is applied to the third region well tap 170.

When the first pocket well 124 surrounding the first well 122 is formed, the junction breakdown voltage can be made higher than when the first pocket well 124 is not formed. Accordingly, when a higher erasing voltage is needed, the first pocket well 124 may be formed to increase the junction breakdown voltage. The same level of voltage as the erasing voltage may be applied to the third region well tap 170.

When such a data erasing voltage is applied, electrons stored in the floating gate 166 of the access transistor Tr are F-N tunneled toward the source/drain regions 142 and 144 so that the data is erased. Since a high voltage is applied to the first well 122 via the first region well tap 146, as well as to the source/drain regions 142 and 144 upon the application of the data erasing voltage, junction breakdown between the source/drain regions 142 and 144 and the first well 122 can be substantially prevented upon the application of the high erasing voltage. Furthermore, since a high voltage is applied even to the third region well tap 170, the PN diode junction between the first P+ region well tap 146 and the N type well 110 in the first region I is substantially prevented from being activated.

In the EEPROM according to an embodiment of the present invention, when the erasing voltage is applied to the source/drain regions of the access transistor in the first region in a data erasing operation, it can be simultaneously applied to the substrate of the first region via the first region well tap. Accordingly, even when a relatively high erasing voltage is applied, the source/drain regions and the neighboring substrate in the first region maintain the same electric potential, so that junction breakdown between them does not occur. Similarly, when the programming voltage is applied to the impurity regions formed under the floating gate in the second region in a, data programming operation, it can be simultaneously applied to the second region via the second region well tap. Accordingly, even when a relatively high level programming voltage is applied, the impurity regions and the neighboring substrate in the second region maintain the same electric potential, so that junction breakdown between them does not occur.

In the EEPROM according to an embodiment of the present invention, when the data erasing voltage or the data programming voltage is applied, a high voltage is applied at the same level as the erasing voltage or the programming voltage to the N type well via the third region well tap. Accordingly, the PN diode junction between the first region well tap and the N type well or between the second region well tap and the N type well can be substantially prevented from being turned on and the generation of leakage current can be substantially prevented.

Furthermore, in the first region and the second region, the junction breakdown voltage between the N type well and the first and second pocket wells becomes higher by respectively surrounding the first well and the second well with the first pocket well and the second pocket well having the same conductivity type and a lower impurity concentration. This stabilizes the erasing operation and programming operation, thus achieving reliability of the EEPROM device.

Particularly, when the EEPROM memory cell according to an embodiment of the present invention is formed in an LDI process, various wells for forming various transistors such as LV, MV, and HV transistors, which are formed in the LDI process, are utilized. Thus, an EEPROM that can stably operate at a relatively high voltage can be implemented without adding a separate process for forming wells.

While the present invention has been particularly shown and described with reference to embodiments thereof, it will be understood by those of ordinary skill in the art that various changes in form and details may be made therein without departing from the spirit and scope of the disclosure.

What is claimed is:

1. A method for erasing information stored in one memory cell including one access transistor and one control gate of the EEPROM comprising:
   an active area of a first conductivity type formed in a semiconductor substrate;
   a gate line formed on the active area;
   a first well of a second conductivity type formed in a first region of the active area;
   an access transistor having a floating gate formed of part of the gate line located on the first region, and a source region and a drain region formed at opposite sides of the floating gate in the first well;
   a first well tap of the second conductivity type spaced apart from the source and drain regions in the first well and having a higher impurity concentration than that of the first well;
   a control gate formed of part of the gate line located on a second region in the active area spaced apart from the first region;
   first impurity regions formed at both sides of the control gate in the second region of the active area;
   a second well tap of the first conductivity type formed in a third region of the active area spaced apart from the first region and the second region and having a higher impurity concentration than that of the active area;
   a second well of the second conductivity type in the second region of the active area spaced apart from the first well and surrounding the first impurity regions; and
   a third well tap in the second well spaced apart from the first impurity regions and having a higher impurity concentration than that of the second well,
   the method comprising:
   applying a predetermined erasing voltage to the source/drain regions of the access transistor and the first well tap;
   applying a ground voltage to the first impurity regions in the second region; and
   applying a voltage, which is greater than 0V and less than a junction breakdown voltage between the active area and the first well, to the second well tap.

2. The method of claim 1, further comprising applying a voltage substantially equal to the erasing voltage to the second well tap.

3. The method of claim 1, further comprising applying the ground voltage to the third well tap in the second well upon applying the ground voltage to the first impurity regions in the second region.

4. A method for programming information in one memory cell including one access transistor and one control gate of the EEPROM comprising:
   an active area of a first conductivity type formed in a semiconductor substrate;
   a gate line formed on the active area;
   a first well of a second conductivity type formed in a first region of the active area;
   an access transistor having a floating gate formed of part of the gate line located on the first region, and a source region and a drain region formed at opposite sides of the floating gate in the first well;
   a first well tap of the second conductivity type spaced apart from the source and drain regions in the first well and having a higher impurity concentration than that of the first well;
   a control gate formed of part of the gate line located on a second region in the active area spaced apart from the first region;
   first impurity regions formed at both sides of the control gate in the second region of the active area;
   a second well tap of the first conductivity type formed in a third region of the active area spaced apart from the first region and the second region and having a higher impurity concentration than that of the active area;
   a second well of the second conductivity type in the second region of the active area spaced apart from the first well and surrounding the first impurity regions; and a third well tap in the second well spaced apart from the first impurity regions and having a higher impurity concentration than that of the second well, the method comprising:

applying the ground voltage to the source/drain regions;

applying a predetermined programming voltage to the first impurity regions and the third well tap in the second region; and applying a voltage, which is greater than 0V and less than a junction breakdown voltage between the active area and the second well, to the second well tap.

5. The method of claim 4, further comprising applying a voltage substantially equal to the programming voltage to the second well tap.

* * * * *